United States Patent
Haas et al.

(10) Patent No.: US 11,295,665 B2
(45) Date of Patent: Apr. 5, 2022

(54) DISPLAYING DEVICE ENABLING A DAY-AND-NIGHT DISPLAY

(71) Applicant: MICROOLED, Grenoble (FR)

(72) Inventors: Gunther Haas, Saint-Egreve (FR); Eric Marcellin-Dibon, Vaucresson (FR)

(73) Assignee: MICROOLED, Grenoble (FR)

( * ) Notice: Subject to any disclaimer, the term of this patent is extended or adjusted under 35 U.S.C. 154(b) by 0 days.

(21) Appl. No.: 17/283,282

(22) PCT Filed: Oct. 17, 2019

(86) PCT No.: PCT/IB2019/001027
§ 371 (c)(1),
(2) Date: Sep. 3, 2021

(87) PCT Pub. No.: WO2020/084338
PCT Pub. Date: Apr. 30, 2020

(65) Prior Publication Data
US 2021/0398481 A1 Dec. 23, 2021

(30) Foreign Application Priority Data
Oct. 22, 2018 (FR) ..................................... 1801112

(51) Int. Cl.
*G09G 3/32* (2016.01)
*G09G 3/3225* (2016.01)
(Continued)

(52) U.S. Cl.
CPC .......... *G09G 3/3225* (2013.01); *G09G 3/2003* (2013.01); *H01L 27/3213* (2013.01);
(Continued)

(58) Field of Classification Search
CPC ...... G09G 3/32; G09G 3/3225; G09G 3/2003; G09G 2300/0452; G09G 2320/046;
(Continued)

(56) References Cited

U.S. PATENT DOCUMENTS 7,580,097 B2 * 8/2009 Moon ............... G02F 1/133555
349/104
9,858,847 B2 * 1/2018 Matsueda ............ G09G 3/2074
(Continued)

FOREIGN PATENT DOCUMENTS

| WO | 2009031547 A1 | 2/2009 |
| WO | 2010048117 A2 | 4/2010 |

OTHER PUBLICATIONS

Cakmakci et al., "Head-worn Displays: A Review,"Journal of Display Technology, vol. 2, No. 3, IEEE, Sep. 2006, pp. 199-215.

*Primary Examiner* — Pegeman Karimi
(74) *Attorney, Agent, or Firm* — Jordan IP Law, LLC; Todd A. Vaughn

(57) ABSTRACT

Displaying device comprising an emissive display and at least one controller configured to control said Mrs display, said display comprising a matrix array (100) of light-emitting pixels deposited on a substrate, each pixel (101) being formed, at least in one portion of said emissive display, of a plurality of elementary emitting zones Z, said elementary emitting zones Z comprising at least one elementary emitting zone $Z_A$ of a first group A and at least one elementary emitting zone $Z_B$ of a second group B, said device being characterised in that the ratio S of the sum $S_B$ of the areas of the elementary emitting zones $Z_B$ of the second group B and of the sum $S_A$ of the areas of the elementary emitting zones $Z_A$ of the first group A, which is defined by $S=S_B/S_A$, is lower than 0.35, preferably lower than 0.20, more preferably lower than 0.10, and even more preferably lower than 0.05.

20 Claims, 6 Drawing Sheets

(51) Int. Cl.
 *G09G 3/20* (2006.01)
 *H01L 27/32* (2006.01)
(52) U.S. Cl.
 CPC . *H01L 27/3216* (2013.01); *G09G 2300/0452* (2013.01); *G09G 2320/046* (2013.01); *G09G 2320/048* (2013.01); *G09G 2360/144* (2013.01)
(58) Field of Classification Search
 CPC ....... G09G 2320/048; G09G 2360/144; G09G 3/006; H01L 27/3213; H01L 27/3216; H01L 28/20; G06F 3/1431; G06F 3/14; G02F 1/13; G02F 1/136204; H05K 1/0277
 See application file for complete search history.

(56) References Cited

U.S. PATENT DOCUMENTS

| | | |
|---|---|---|
| 2005/0225574 A1* | 10/2005 | Brown Elliott .......... G09G 3/20 345/694 |
| 2011/0278604 A1 | 11/2011 | Takata |
| 2013/0127980 A1 | 5/2013 | Haddick et al. |
| 2013/0141808 A1 | 6/2013 | Lovegrove et al. |
| 2017/0148366 A1* | 5/2017 | Hsin ................... H01L 27/3213 |
| 2018/0082625 A1 | 3/2018 | Sumin et al. |
| 2020/0193899 A1* | 6/2020 | Li .......................... G09G 3/035 |

* cited by examiner

DISPLAYING DEVICE ENABLING A DAY-AND-NIGHT DISPLAY

CROSS-REFERENCE TO RELATED APPLICATIONS

The present application is a National Stage Application of PCT International Application No. PCT/IB2019/001027 (filed on Oct. 17, 2019), under 35 U.S.C. § 371, which claims priority to French Patent Application No. 1801112 (filed on Oct. 22, 2018), which are each hereby incorporated by reference in their complete respective entireties.

TECHNICAL FIELD

The invention relates to the field of electronics, and more specifically that of matrix array displaying devices. It particularly relates to an LED or OLED type matrix array display. This matrix array display is designed to enable display in two different modes of use, according to ambient light intensity; it particularly enables a display in day mode or in night mode.

BACKGROUND

Matrix array displaying devices are configured for a display either of graphic images (such as icons, targets, letters, numbers), or for a display of video images (for example images recorded by a camera); optionally these two types of images can be overlaid. These displaying devices are used for example in "head-up displays" which allow a view of the external environment at the same time, and which generally comprise a micro-display and an optical system making it possible to project the image of the micro-display into the user's eye; this type of optical system is known as "see-through". The optical principles of these devices are presented in the article "Head-Worn Displays: A Review" by O. Cakmakci and J. Rolland, published in 2006 in Journal of Display Technology 2 (3), p. 199-921. A large number of patent documents propose different designs, for example, U.S. Patent Application Publication No. 2013/0127980 (Osterhout Group, Inc.). Head-up displaying devices are used for example in pilots' helmets or goggles, but also in leisure type applications, particularly for sports. They are also increasingly used in cars.

In many cases, these systems have two different modes of use, referred to here as "day mode" and "night mode". These two modes are distinguished firstly by the brightness thereof: about 10,000 cd/m2 to 20,000 cd/m2 in day mode, and a few cd/m2 in night mode. They can also be distinguished by the type of images displayed: in day mode, graphic information overlaid on the natural view is essentially displayed, for example images of targets, alphanumeric information in respect of geolocation (GPS), distance or speed, whereas in night mode, the image of night vision and/or thermal night vision sensors are displayed, optionally with overlaid symbols.

It is known that the brightness of LED or OLED matrix array displays decreases according to the time of use thereof. This aging is exponentially dependent on the brightness. The pixel will therefore undergo very pronounced aging in day mode, and very little aging in night mode. This aging will lead to another undesirable effect, common to all emissive screens (tubes, plasma, OLED, LED screens) known as "remanence", "image burn-in" or "sticking image". By way of example, if during operation in day mode graphic elements on a black background are displayed for hundreds of hours (for example a target), the illuminated pixels will be subject to significant aging whereas the pixels which mostly form part of the black background will practically not age. If this display is used in night mode with video images, a residual reverse image overlaid on the video image will be observed.

This problem is well-known to a person skilled in the art, but few solutions have been described. The main solution is curative: it is attempted to compensate for the deterioration of the pixel. Thus, WO 2009/031547 (Canon Kabushiki Kaisha) proposes electronic compensation of the image remanence for an active matrix OLED screen wherein each pixel comprises one white pixel and three color pixels (R=red, G=green, B=blue). In this method, when the pixel must display a high white light intensity, not only is the white subpixel illuminated, but also the three other RGB subpixels, so as to obtain additional white light intensity which makes it possible to lower the intensity of the white subpixel. Another curative approach is described in WO 2010/048117 (Motorola). It involves counting the illumination time for each pixel, following by individual compensation after filtering of the image that would be obtained in the absence of compensation. A further curative approach is described in US 2018/0082625 (Samsung); it is based on adjusting gray scales. US 2011/0278604 (Canon Kabushiki Kaisha) proposes a preventive approach wherein the pixels displaying characters or images and the pixels corresponding to the background of the display are identified at all times, and the brightness of the display of the characters or images is adjusted, while retaining the image contrast.

All these methods are complex and involve substantial numerical computations for image analysis and reprocessing. They are capable of degrading the image.

The problem addressed by the present invention is that of reducing, and if possible removing, in a high-brightness graphic emissive display, the remanence effect on a video type display, particularly in a low-brightness display mode. A further problem addressed by the present invention is that of bringing the operating conditions of pixels between a high-brightness display mode and a low-brightness display mode closer together so as to minimize the reduction of the brightness in mixed use, i.e., alternating between the high-brightness mode and the low-brightness mode, and also to benefit from the same image quality particularly in terms of contrast and rendering in both modes.

SUMMARY

The inventors observed that the remanence problem becomes particularly acute when the display is used alternately at high brightness and at low brightness. More specifically, pixel degradation occurs particularly when images in static mode, such as graphic and/or alphanumeric data, are displayed at high brightness. If this display is performed on a black background, the resulting remanence is not visible, or barely visible. On the other hand, it becomes particularly visible when displaying at low brightness on a light background, for example when images from a night vision or thermal camera are displayed.

According to the invention, this problem is solved by subdividing the elementary emitting zones into two groups, namely a first group A, used for displaying images (or data) in static mode or representing relatively non-dynamic image, with quite a high brightness, and a second group B, used for displaying data representing a dynamic image (such as video data) with quite a low brightness.

Typically, within each pixel at least one elementary emitting zone of the group A is reserved for displaying static images. However, this should not degrade the resolution of the display for the display of images in dynamic mode (such as video data). For a white display, it may be sufficient that for each pixel it is configured that the group A comprises a single elementary zone, whereas the group B typically comprises an elementary emitting zone for each of the three elementary colors (red, blue, green) and possibly an additional white elementary emitting zone.

According to an essential feature of the invention, for each pixel, the sum of the areas of the elementary emitting zones of the group B is significantly smaller than the sum of the areas of the elementary emitting zones of the group A.

The invention firstly relates to a displaying device comprising an emissive display and at least one controller configured to control said emissive display, said display comprising a matrix array of light-emitting pixels deposited on a substrate, each pixel being formed, at least on one portion of said emissive display, of a plurality of elementary emitting zones Z, said elementary emitting zones Z comprising at least one elementary emitting zone ZA of a first group A and at least one elementary emitting zone ZB of a second group B, said device being characterized in that the ratio S of the sum SB of the areas of the elementary emitting zones ZB of the second group B and of the sum SA of the areas of the elementary emitting zones ZA of the first group A, which is defined by S=SB/SA, is less than 0.35, preferably less than 0.20, more preferably less than 0.10, and even more preferably less than 0.05.

The device can be configured so that the maximum brightness LA emitted by the activated elementary emitting zones of the first group A is at least 10 times, preferably at least 100 times, and even more preferably at least 1000 times greater than the maximum brightness emitted by the activated emitting zones of the second group B.

The device can be configured such that the elementary emitting zones of the group A generate a monochrome display, for example green or red or white, and the elementary emitting zones of the group B generate a display of the same color.

In a further embodiment, the device can be configured such that the elementary emitting zones of the group A generate a monochrome display, for example white or green or red, and the elementary emitting zones of the group B generate a monochrome display of another color.

In a further embodiment, the device can be configured such that the elementary emitting zones of the group A generate a monochrome display, for example white or green or red, and the elementary emitting zones of the group B generate a color display, for example RGB type (using red, green, and blue subpixels) or RGBW type (using red, green, blue and white subpixels).

In a further embodiment, the device can be configured such that the elementary emitting zones of the group A generate a color display, and the elementary emitting zones of the group B generate a monochrome display.

In a further embodiment, the device can be configured such that the elementary emitting zones of the group A generate a color display, and the elementary emitting zones of the group B generate a color display.

In all the embodiments of the present invention, said colors can be obtained using filters located between said elementary emitting zones and the user of the device.

In an embodiment, the device comprises a first control block configured to control a graphic and/or alphanumeric data stream capable of being displayed on said pixel matrix array, and a second control block configured to control a video data stream capable of being displayed on said pixel matrix array. Said first control block is then advantageously configured to display said graphic or alphanumeric data stream on the elementary emitting zones of the first group A, and said second control block is advantageously configured to display said video data stream on the elementary emitting zones of the second group B.

In this specific mode, the video data are typically synchronous, periodically refreshed (updated) data, this refreshing being typically controlled by a clock. On the other hand, for graphic or alphanumeric mode, the image can be static and reset (i.e., updated) as needed (i.e., each elementary emitting zone can be refreshed by sending a new data item only when the content of the static memory thereof will change following this saving of the new data item in said static memory), or refreshed periodically. In the first case, this concerns asynchronous data, which are not dependent on a clock; in the second case, it can concern synchronous data.

Video data can therefore have a refresh rate (also known as refresh frequency) greater than that of graphic or alphanumeric data. By way of example, when the graphic or alphanumeric image is refreshed periodically, the refresh rate of this image can be low, particularly less than 0.1 Hz (or even 0 Hz); it is advantageously of the order of 0.1 Hz to 1 Hz, but can attain a frequency greater than 10 Hz. The refresh rate of video data can typically be between 30 Hz and 120 Hz, preferably between 60 Hz and 120 Hz.

As a general rule, the device according to the invention can be configured so that the elementary zones of the first group and the elementary zones of the second group do not emit at the same time, and/or can be configured so that the elementary zones of the first group emit when the ambient brightness is greater than a first threshold value, and preferably only in this case, and/or can be configured so that the elementary zones of the second group emit when the ambient brightness is less than a second threshold value, and preferably only in this case; said first threshold value is for example greater than or equal to said first threshold value. The device can comprise a means for detecting whether the ambient brightness is greater or less than said first and/or said second threshold value, and for activating and/or deactivating the elementary zones of the group which are to emit or not to emit.

The invention is preferably applied to displays selected from the group formed by: plasma displays, light-emitting diode (LED) displays, organic light-emitting diode (OLED) displays.

DRAWINGS

FIGS. 1 and 2 illustrate the prior art, whereas FIGS. 3 to 8 represent different embodiments and aspects of the invention; they are given here by way of illustration and do not limit the scope of the invention.

FIG. 1 schematically represents the front view of a monochrome pixel of a display according to the prior art.

FIG. 2 shows the aging curve of an OLED display formed of pixels according to FIG. 1, used at low brightness in a mode referred to here as "night mode" (curve (a)), and used at high brightness in a mode referred to here as "day mode" (curve (b)). The horizontal axis represents the illumination time of the pixel in hours, the vertical axis the relative brightness of the pixel.

FIG. 3 schematically represents a front view of a monochrome pixel of a display according to the invention, enabling alternately a display in day mode and in night mode.

Figure 6:
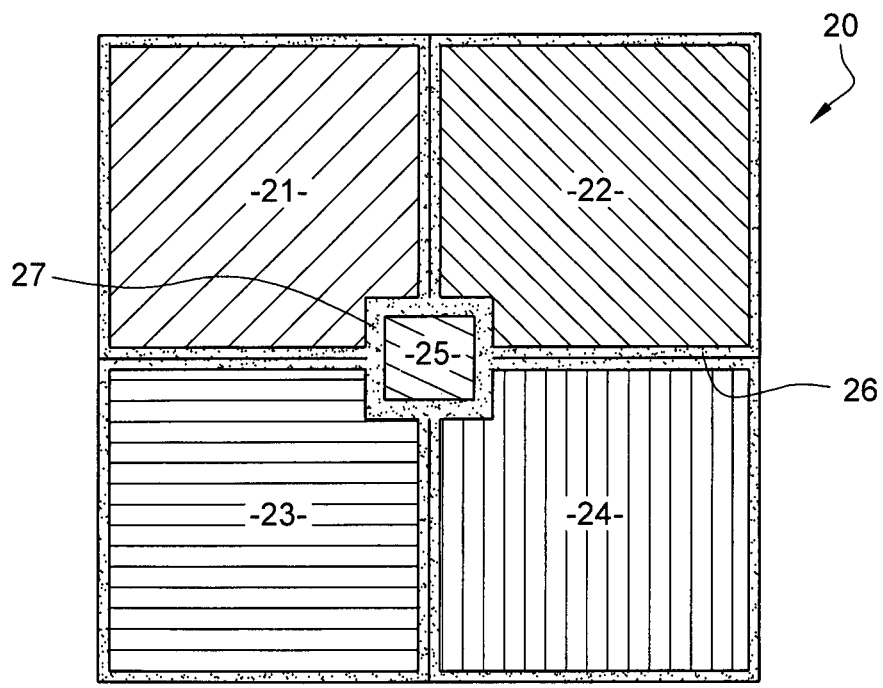

FIG. 6 schematically represents a front view of a color pixel of a display according to the invention; the structure is RGBW/W type, enabling color display in day mode and white display in night mode.

FIGS. 7(a) and 7(b) each schematically represent a front view of another color pixel of a display according to the invention; the structure is RGB/W type, enabling, for the embodiment in FIG. 7(a), color display in day mode and white display in night mode, and for the embodiment in FIG. 7(b), color display in night mode and white display in day mode.

Figure 8:
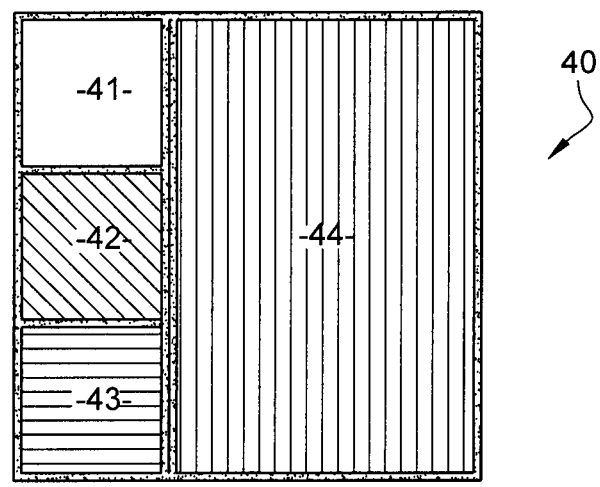

FIG. 8 schematically represents a front view of another color pixel of a display according to the invention; the structure is W/RGB type.

Figure 9:
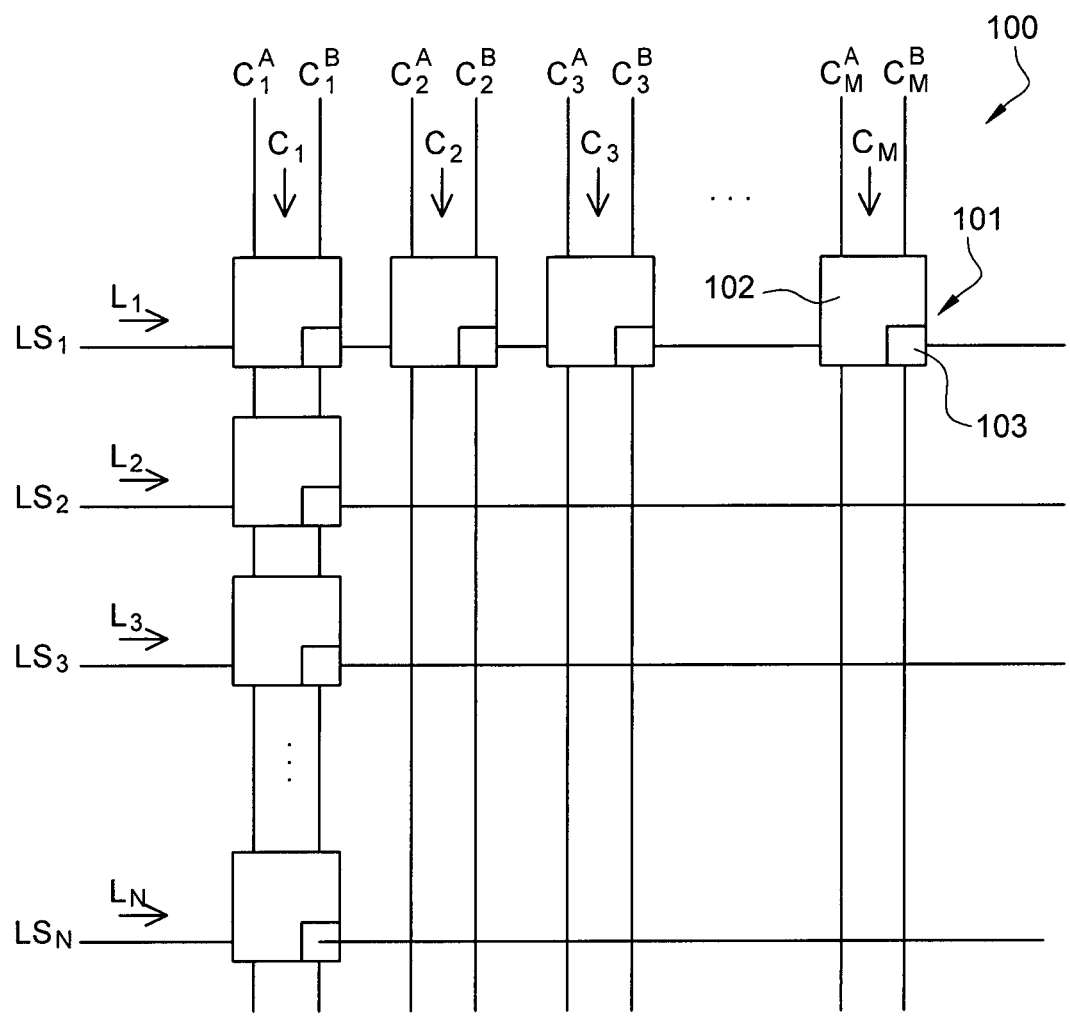

FIG. 9 schematically represents the structure of the rows and columns of a matrix array display according to the invention.

Figure 10A:
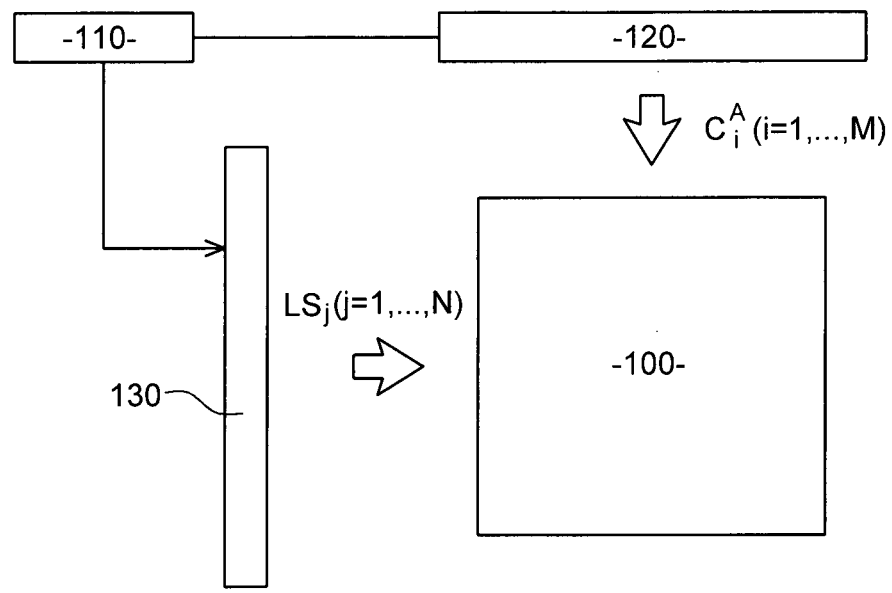
Figure 10B:
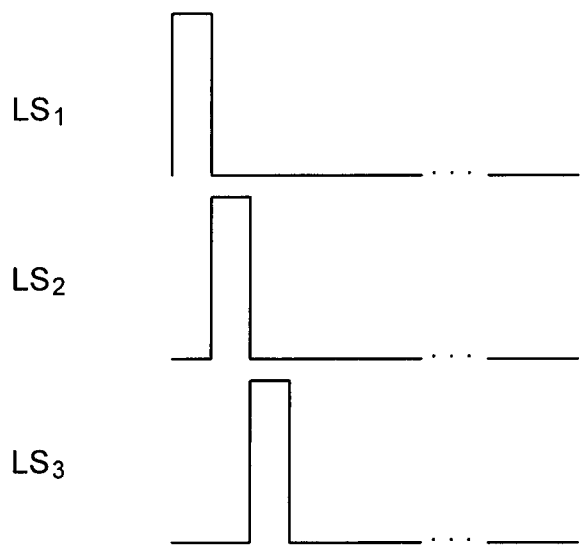
Figure 10B:
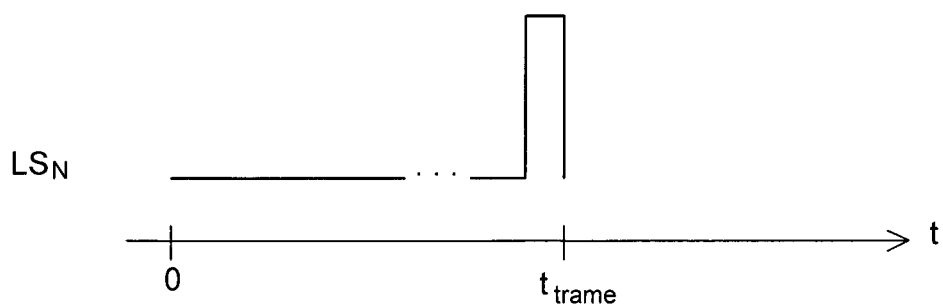

FIG. 10 schematically represents the signals applied to the rows for a frame period $t_{frame}$.

DETAILED DESCRIPTION

The invention will be explained here with reference to an OLED type pixel matrix array, but can also be implemented with a light-emitting pixel matrix array using inorganic semiconductors or light-emitting diodes (LEDs).

Hereinafter, the high-brightness display mode is referred to as "day" mode and the low-brightness display mode as "night" mode.

Figure 1:
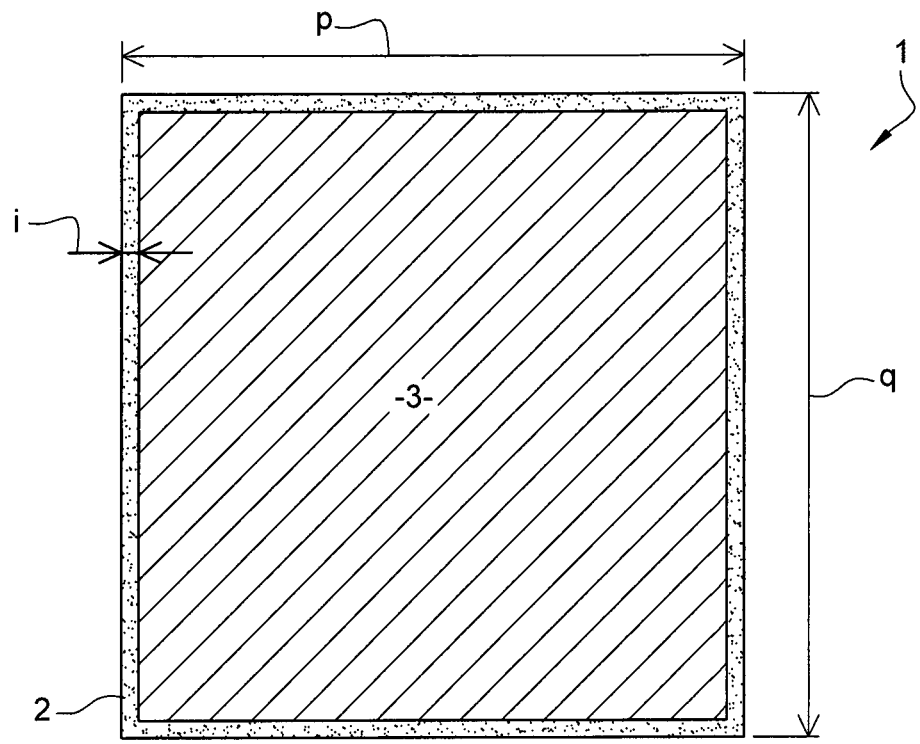

According to the prior art, for a pixel matrix array of a monochrome light-emitting screen, each elementary emitting zone corresponds generally to one pixel; for a color screen, each pixel is broken down into several subpixels with individual addressing, and these subpixels then correspond to the elementary emitting zones. FIG. 1 shows an OLED type monochrome pixel of a displaying device according to the prior art. This pixel 1 has an elementary emitting zone 3 of a horizontal pitch p and a vertical pitch q substantially identical to p. It comprises an electrical isolation zone 2 which surrounds it completely; this electrical isolation zone 2 has a width i on the perimeter thereof. The total active area S of the pixel 1, excluding the electrical isolation zone 2, is thus equal to (p−2i)(q−2i). The active areas of two neighboring pixels are therefore separated by an electrical isolation zone of width 2i.

Figure 2:
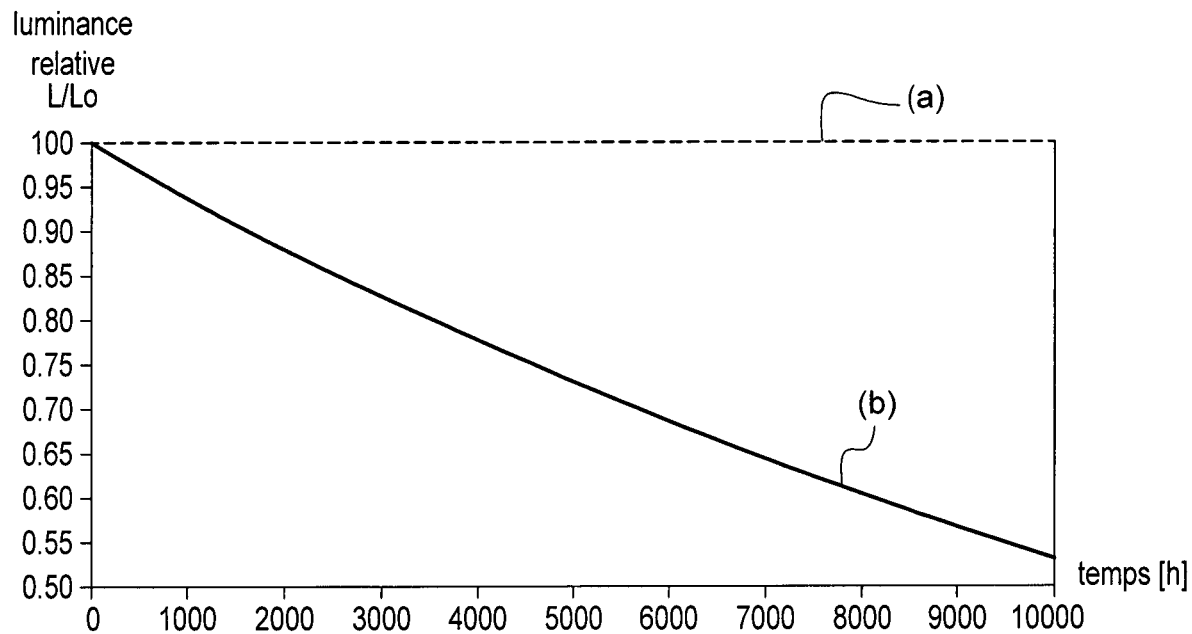

Such a display is normally controlled such that the current density through the light-emitting diode is very different in day mode and in night mode. This explains the substantial aging of the pixel in day mode, as seen in FIG. 2. It is seen that the pixel used in night mode ages very little (curve (a)): the brightness L virtually keeps the initial value $L_0$ even after 10,000 hours of emission. The corresponding curve for the pixel used in day mode (curve (b)) shows a substantial decline.

Figure 3:
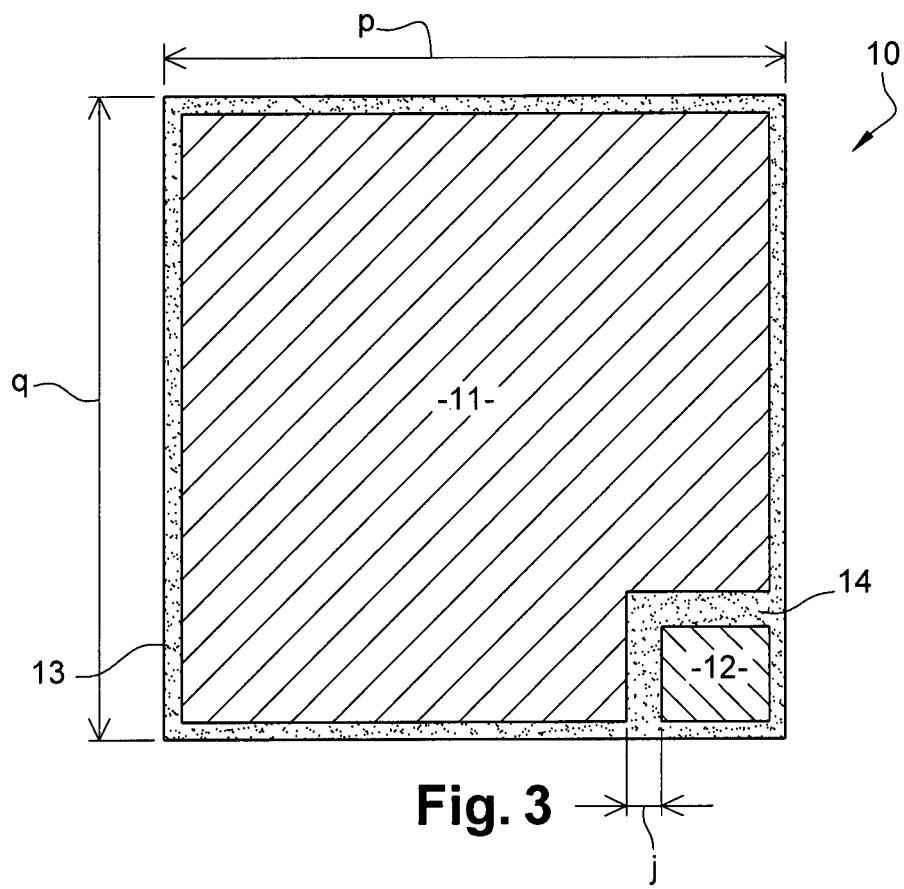

The invention will be described firstly for a monochrome display embodiment, which represents the simplest case. FIG. 3 shows a pixel 10 of an OLED type monochrome display according to the invention. This pixel has a width p and a length q substantially equal to the width. It comprises an electrical isolation zone 13 of width i which surrounds it completely. According to an essential feature of the invention, the pixel 10 comprises a first 11 and a second 12 elementary emitting zone. The total active area of the pixel 10, excluding the electrical isolation zone 13, thus comprises the area $S_A$ of said first elementary emitting zone 11, and the area $S_B$ of said second elementary emitting zone 12. The area $S_A$ of the first elementary emitting zone 11 is greater than the area $S_B$ of the second elementary emitting zone 12, and preferably at least five times, and even more preferably ten times greater. An electrical isolation zone 14 of width j separates the two areas $S_A$ and $S_B$.

According to the invention, the display is configured such that the first 11 and second 12 elementary emitting zone of the pixel 10 can be addressed separately from one another, and such that the first elementary emitting zone 11 of area $S_A$ is used for displaying in day mode and the second elementary emitting zone 12 of area $S_B$ is used for displaying in night mode. Preferably, the area $S_A$ is used only for displaying in day mode, and the area $S_B$ is used only in night mode. Given that in night mode the brightness of the display which is required for the display to be clearly visible by the user can be much lower than in day mode, the ratio of the areas $S=S_B/S_A$ can be less than 1.

Dividing the monochrome pixel 10 into two subpixels 11,12 of area $S_A$ and $S_B$ which can be addressed completely separately makes it possible to prevent the remanence problem generated by day mode and visible essentially in night mode. In this way, the remanence effect does not occur. Compared to the monochrome pixel of the prior art in FIG. 1, the active area $S_A$ available for the display in day mode is slightly smaller, which necessitates increasing the current density slightly. The smaller the ratio of the areas $S=S_B/S_A$, the less this increase of the current density in the subpixel 11 of area $S_A$ is significant, and the less it is likely to accelerate the degradation and therefore the loss of brightness of this subpixel 11.

On the other hand, the aging of the subpixel 12 of area $S_B$ (typically used in night mode) of the display according to the invention is very low compared to the aging of the subpixel 11 of area $S_A$ (typically used in day mode). The area $S_B$ of the pixel used in night display mode may be very small with respect to the area $S_A$ of the pixel used in day display mode. Preferably, $S=S_B/S_A$ is less than 0.20, more preferably less than 0.10, and even more preferably less than 0.05. In an advantageous embodiment, the ratio of areas $S=S_B/S_A$ is selected such that the current densities and therefore the aging curves in day and night mode are closer.

The electrical isolation zone 14 which separates the zones SA and SB can have a width j of about 2i. This distance can optionally be reduced as there is not necessarily a need for optical or electrical isolation between the areas SA and SB compared to the isolation between two pixels; this reduction in the optically inactive zones of the pixel matrix array makes it possible to improve the quality of the display, as well as the lifetime thereof. Indeed, when the width of the electrical isolation zone increases, the current density seen by the OLED layer must be increased, which lowers the lifetime thereof. In practice, i is typically of the order of 0.5 µm, according to the CMOS technologies currently available. Preferably, the width j of the inactive zone 14 does not exceed 2i; it can be between i and 2 i.

If several different elementary emitting zones (typically of different color) are used to form the subpixel intended for day display, and examples will be given hereinafter, that which has been stated above in respect of the area ratio S is valid for the sum of the elementary emitting zones intended for day display. The equivalent observation applies in the case where several different elementary emitting zones (typically of different color) are used to form the subpixel intended for night display: the area ratio S is applied to the sum of the elementary emitting zones intended for night display.

Figure 4:
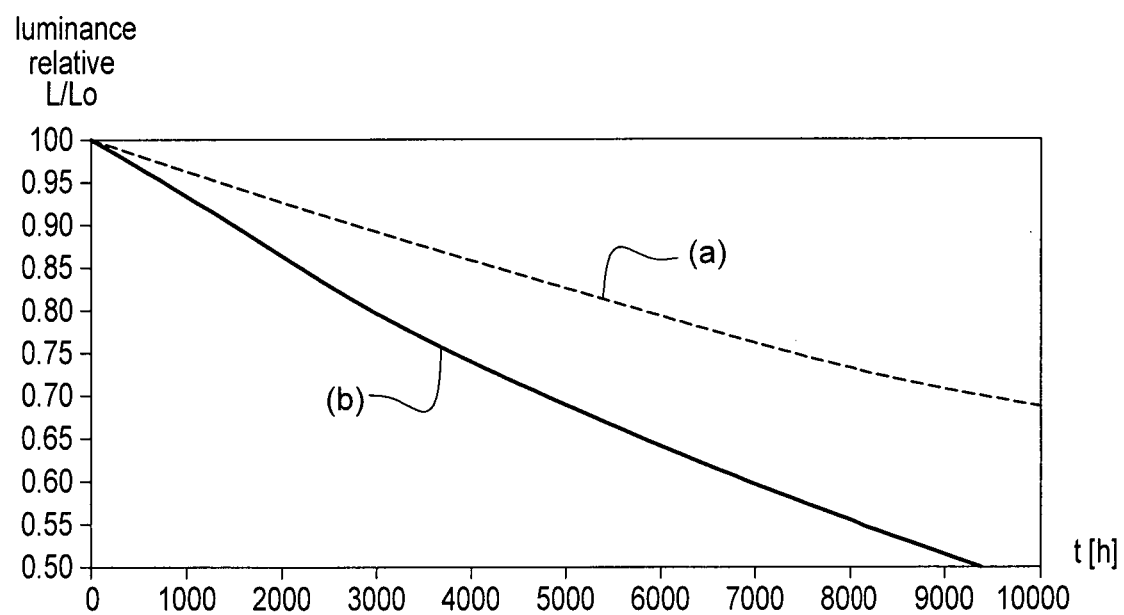
FIG. 4 shows the aging curve of an OLED display formed of pixels according to FIG. 3, used at low brightness in night mode (curve (a)) and at high brightness in day mode (curve (b)). The horizontal axis represents the illumination time of the pixel in hours, the vertical axis the relative brightness of the pixel.

FIG. 4 shows the OLED display degradation curves according to FIG. 3 in day mode and night mode, with an area ratio S=0.035. It is seen that the lifetime of the two elementary emitting zones (curve (a): elementary emitting zone 12 of area $S_B$; curve (b): elementary emitting zone 11 of area $S_A$) decreases slightly with respect to the prior art represented by FIG. 2. However, in practice, this difference is not very significant, and it can be reduced by suitable measures. In particular, the value of the ratio of areas S can be optimized according to the relative time of use in day mode and in night mode, which makes it possible to minimize the degradation of the total brightness during the use of the two modes. Moreover, as mentioned above, the fraction of the inactive zone 14 can be reduced, for example by reducing the width j thereof below the value 2 i. As the two elementary emitting zones 12,13 of the pixel 1 are not used simultaneously, reducing the electrical or optical isolation will not degrade the screen resolution, unlike for the isolation between two pixels.

Figure 5:
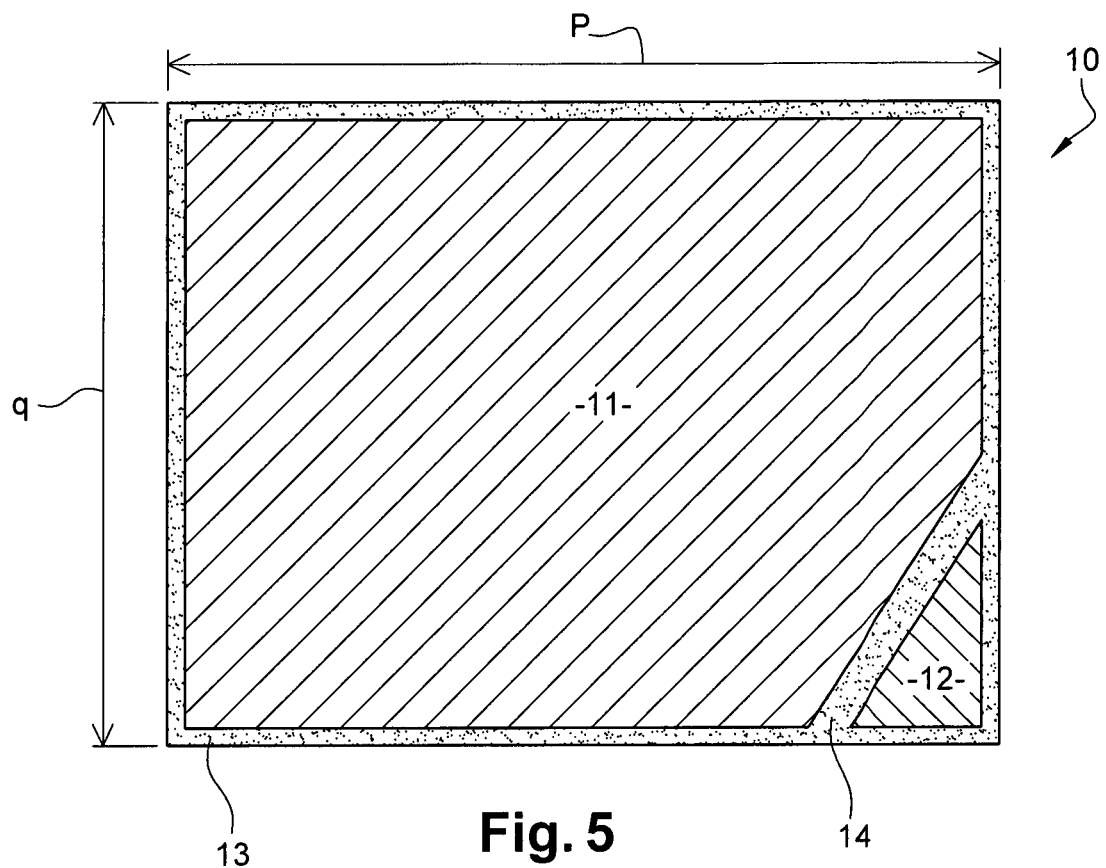
FIG. 5 shows a further embodiment of a monochrome pixel of a display according to the invention.

This monochrome display according to the invention can be embodied according to several alternative embodiments. In a first alternative embodiment (not shown in the figures), the pixel does not have a square shape but a rectangular or other shape. In a second alternative embodiment of the invention, the second elementary emitting zone of the pixel does not have a square shape but a rectangular or other shape. These two alternative embodiments can be combined, as shown in FIG. 5 where the pixel 10 has a rectangular shape and the second elementary zone 12 has a triangular shape.

We now describe a color display screen pixel matrix array according to the invention. In a known manner, all the elementary emitting zones can emit white light and said colors can be obtained using filters located between said elementary emitting zones and the user of the device. Alternatively, the elementary emitting zones can be designed to emit light of the desired spectral color directly.

FIG. 6 shows a first embodiment. The elementary pixel 20 of a color screen comprises several elementary emitting zones (subpixels), in this example an emitting zone for each of the three primary colors red 21, green 22, blue 23, which can optionally be supplemented by a fourth white subpixel 24. According to the invention, these zones are used in day mode. Two of these neighboring elementary emitting zones are separated by an electrical isolation zone 26 of width i. A further elementary emitting zone 25, used according to the invention in night mode, is located at the center of the pixel 20. It is separated from the neighboring elementary emitting zones 21, 22, 23, 24 by an inactive zone 27 of width j, wherein the value is typically greater than i, and which can be 2i or less, as explained with reference to FIG. 3.

Figure 7:
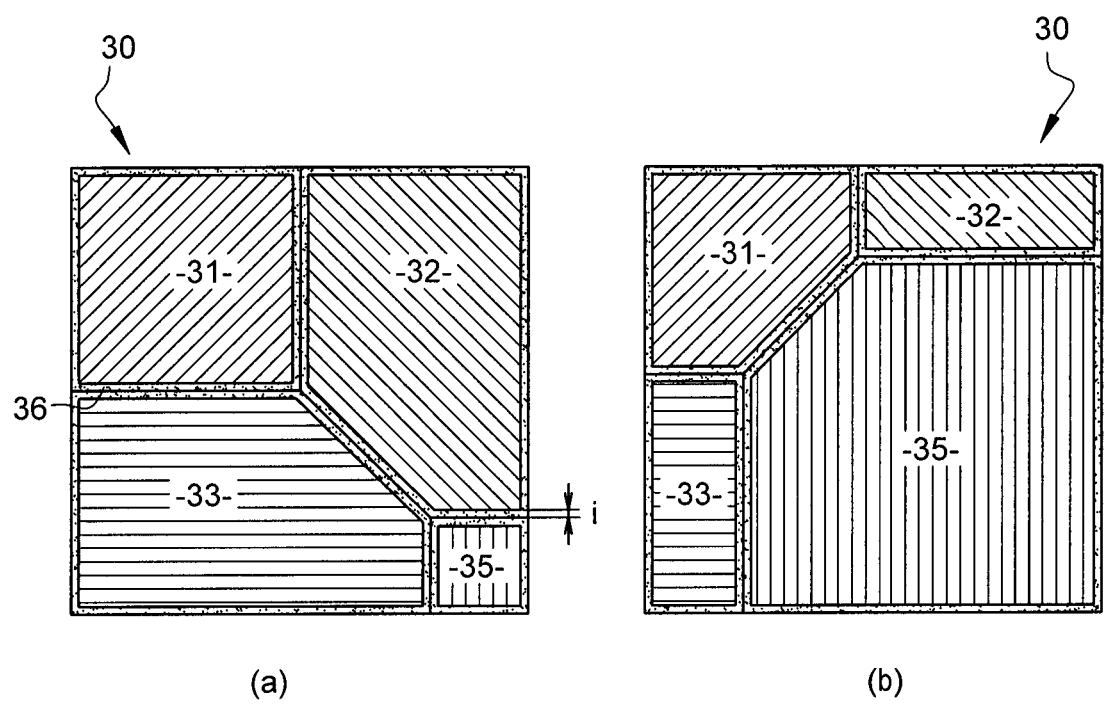

FIG. 7 shows two further embodiments of a color screen. FIG. 7(a) shows an elementary pixel 30 of a display screen, said pixel comprising an elementary emitting zone for each of the three primary colors red 31, green 32, blue 33; these color zones (abbreviated as RGB here) form the zones of the group A and can be used for example in day mode. A further elementary emitting zone 35, which forms the group B, emits white light. All the elementary emitting zones are separated by an electrical isolation zone 36 of width i. The zone of the group B can be used in night mode.

FIG. 7(b) shows an elementary pixel of a further display screen, said pixel comprising an elementary emitting zone for each of the three primary colors red 31, green 32, blue 33; these color zones (abbreviated as RGB here) form the zones of the group B and can be used for example in night mode. A further elementary emitting zone 35, which forms the group A, emits white light. The zone of the group A can be used in day mode.

The embodiment of a pixel 40 shown in FIG. 8 is optimized for a particular case of use, wherein color video images are displayed in night mode; the elementary emitting zones of red 41, green 42 and blue 43 color form the zones of the group B and generate these low-brightness video images. In day mode, a high-brightness monochrome (for example white) graphic data item is displayed by the subpixel 44 (which represents the group A) wherein the area is significantly greater than that of the subpixels used for night mode. Obviously, the RGB elementary emitting zones 31,32,33 do not need to have the same surface area in relation to one another.

Obviously, in the embodiment in FIGS. 6 and 7(a), the elementary emitting zones 25 and 35 of the group A can emit a light of a color other than white or can be formed themselves of subpixels, for example R, G, and B or R, G, B, and W, and/or the elementary emitting zones of the group B 21-24 and 31-33 can be two in number (for example red and green) or four in number (red, blue, green, white). Similarly, in the embodiment in FIGS. 7(b) and 8, the elementary emitting zones 35 and 44 of the group A can emit a light of a color other than white or can be formed themselves of subpixels, and/or the elementary emitting zones of the group B 31-33 and 41-43 can be two in number (for example red and green) or four in number (red, blue, green, white).

As stated above with reference to FIG. 3, further distributions and allocations of the elementary emitting zones to day mode and to night mode are possible.

The device according to the invention can comprise a top emission matrix array display. It can be formed on an opaque substrate (typically a silicon wafer) or on a transparent substrate, typically a glass wafer coated with a transparent conductive oxide; the light is emitted by the top (i.e., via the face opposite the substrate). Alternatively, the device according to the invention can comprise a matrix array display in bottom emission mode.

In a very preferred embodiment of the invention, all the elementary emitting zones emit white light, and the display color for each elementary emitting zone is generated by a color filter.

FIG. 9 schematically shows the structure of the rows and columns of a display device according to the invention. The figure more particularly shows a matrix array 100 of light-emitting pixels 101 deposited on a substrate, each pixel 101 being formed of two elementary emitting zones, namely a first elementary emitting zone $Z_A$ 102 and a second elementary emitting zone $Z_B$ 103, with a surface area $S_B \ll S_A$. The pixels 101 are aligned along N rows L (from $L_1$ to $L_N$) and M columns (from $C_1$ to $C_M$). The circuits of the pixels can be embodied according to technologies known to a person skilled in the art as acronyms Active Matrix (for example AMOLED) or DRAM (Dynamic Random Access Memory) or alternatively according to the SRAM (Static Random Access Memory) concept.

FIG. 10(a) schematically shows an addressing structure suitable for use for embodying a displaying device according to the invention. The N rows of $L_1$ to $L_N$ of the matrix array 100 of pixels, which can be light-emitting, are controlled by a row driver 130, while the M columns $C_1$ to $C_M$ are controlled by a column driver 120 which receives its signals via a control block 110 typically enabling the management of a video stream until the display thereof on the pixel matrix array 100.

By way of example, in an embodiment of said video stream, which is a digital data stream, is sent to a column driver 120 which comprises successively a horizontal shift register demultiplexer, a digital comparator (which generates an analog data stream) and a sampling and holding circuit, which sends the signal to the vertical gates of the pixel matrix array 100.

The row driver 130 (typically a vertical shift register or a demultiplexer) gives the orders on the horizontal rows of the pixel matrix array 100. In an embodiment, it comprises a sequencer and a vertical shift register; the latter receives from the sequencer the orders to display the information on the rows of pixels.

FIG. 10(b) shows very schematically the scanning frame of the pixel matrix array which is performed row by row. For each of the N rows from $L_1$ to $L_N$ the scanning by the signals of the M columns from $C_1$ to $C_M$ comprises two signals per pixel: one for the elementary emitting zones $Z_A$ of the first group, and one for the elementary emitting zones $Z_B$ of the second group. Thus, on the row $LS_1$ the scanning of the columns $C_1$ to $C_M$ makes it possible to display on the corresponding elementary emitting zones the data of the circuits $C^A_1, C^A_2, \ldots, C^A_M$ and $C^B_1, C^B_2, \ldots, C^B_M$; on the row $LS_2$ the scanning of the columns $C_1$ to $C_M$ makes it possible to display on the corresponding elementary emitting zones the data of the circuits $C^A_1, C^A_2, \ldots, C^A_M$; and so on.

We now describe the use of pixel matrix arrays according to the invention in so-called day mode and night mode.

The device according to the invention can comprise a first control block configured to control a graphic and/or alphanumeric data stream capable of being displayed on said pixel matrix array, and a second control block configured to control a video data stream capable of being displayed on said pixel matrix array. Said first control block can be configured to display said graphic or alphanumeric data stream on the elementary emitting zones of the first group A, and said second control block is configured to display said video data stream on the elementary emitting zones of the second group B.

Alternatively, the device according to the invention can comprise a single control block configured to control both the video data stream and the graphic and/or alphanumeric data stream.

Advantageously, the elementary zones of the first group emit in "day" mode and the elementary zones of the second group emit in "night" mode.

It is possible to configure that the elementary zones of the first group emit when the ambient brightness is greater than a first threshold value, and preferably only in this case. It is possible to configure that the elementary zones of the second group emit when the ambient brightness is less than a second threshold value, and preferably only in this case. Said first threshold value is greater than or equal to said second threshold value.

Switching between day mode and night mode can be manual or automatic; by way of example, the device can comprise means for detecting whether the ambient brightness is greater than or less than said first and/or said second threshold value, and for activating and/or deactivating the elementary zones of the group which are to emit or not to emit. These means can thus adjust the brightness of the display in day mode and/or in night mode to the ambient brightness.

By reference to the terminology introduced with reference to FIG. 9, we describe here several alternative embodiments for the implementation of the invention.

In a first alterative embodiment, a graphic or alphanumeric channel controls the display of the data on the elementary emitting zones of the first group (circuits $C^A_1, C^A_2, \ldots, C^A_M$); the display on the elementary emitting zones of the second group (circuits $C^B_1, C^B_2, \ldots, C^B_M$)) being controlled for example by a video channel.

In a second alternative embodiment, a first video channel controls the display of the data on the elementary emitting zones of the first group (circuits $C^A_1, C^A_2, \ldots, C^A_M$) and a second video channel controls the display on the elementary emitting zones of the second group (circuits $C^B_1, C^B_2, \ldots, C^B_M$).

In a third alternative embodiment, the data displayed on the elementary emitting zones of the first group (circuits $C^A_1, C^A_2, \ldots, C^A_M$) are alphanumeric or graphic data from a computer, and the data displayed on the elementary emitting zones of the second group (circuits $C^B_1, C^B_2, \ldots, C^B_M$) are from a night vision camera.

In a fourth alternative embodiment, the elementary zones of the first group are broken down into subgroups by color, for example the circuit $C^A_1$ is broken down into two, three (or four) circuits $C^{A1}_1, C^{A2}_1, C^{A3}_1, C^{A4}_1$ making it possible to each display a different color (typically red, green, blue, white), this color being capable of being generated indirectly by a colored filter placed on the display wherein all the elementary emitting zones emit a white light, or by a suitable choice of the emitting layer (OLED layer for example) of each of the elementary emitting zones.

In a fifth alternative embodiment, the elementary zones of the second group are broken down into subgroups by color, for example the circuit $C^B_1$ is broken down into two, three (or four) circuits $C^{B1}_1, C^{B2}_1, C^{B3}_1, C^{B4}_1$ making it possible to each display a different color (typically red, green, blue, white), this color being capable of being generated indirectly by a colored filter placed on the display wherein all the elementary emitting zones emit a white light, or by a suitable choice of the emitting layer (OLED layer for example) of each of the elementary emitting zones.

The device according to the invention can be configured such that the maximum brightness LA emitted by the activated elementary emitting zones of the first group A is at least 10 times, preferably at least 100 times, and even more preferably at least 1000 times greater than the maximum brightness emitted by the activated emitting zones of the second group B. The brightness can be controlled by different means. In particular, it is typically dependent on the following factors: the area of the emitting zone; the intrinsic characteristic of emitting zones of the matrix array of light-emitting pixels (for example the nature of the emitting layers in the case of an OLED); the characteristics of any filters used; the current or voltage programming of the emitting zone (which can be determined by the electrical diagram thereof and/or be dependent on external programming, for example by varying a control current or voltage.

LIST OF REFERENCE SYMBOLS

The following reference numbers are used in the present description and in the figures:
1 Monochrome pixel (prior art)
2 Electrical isolation zone
3 Elementary emitting zone
10 Monochrome pixel (invention)
11 First elementary emitting zone
12 Second elementary emitting zone
13, 14 Electrical isolation zone
20, 30 Color pixel (invention)
21, 31, 41 Red elementary emitting zone
22, 32, 42 Green elementary emitting zone
23, 33, 43 Blue elementary emitting zone
24 White elementary emitting zone
25, 35, 44 Monochrome or white elementary emitting zone
40 Color pixel (invention)
26, 27, 36 Electrical isolation zone
100 Pixel matrix array
101 Pixel
102 First elementary emitting zone
103 Second elementary emitting zone
110 Control block
120 Column driver
130 Row driver

The invention claimed is:

1. A displaying device, comprising:
at least one controller; and
an emissive display, controlled by the at least one controller, said emissive display including a pixel matrix array of light-emitting pixels deposited on a substrate, each light-emitting pixel in the light-emitting pixels being formed, at least on one portion of said emissive display, of a plurality of elementary emitting zones that include at least one elementary emitting zone of a first group and at least one elementary emitting zone of a second group,
wherein:
a ratio of a sum of areas of the elementary emitting zones of the second group and of a sum of areas of the elementary emitting zones of the first group is less than 0.05, and
a maximum brightness emitted by activated elementary emitting zones of the first group is at least 1000 times greater than a maximum brightness emitted by activated emitting zones of the second group.

2. The displaying device of claim 1, wherein the emissive display is selected from a group consisting of: displays, light-emitting diode (LED) displays, and organic light-emitting diode (OLED) displays.

3. The displaying device of claim 1, wherein:
the elementary emitting zones of the first group generate a monochrome display, and
the elementary emitting zones of the second group generate a monochrome display of the same or of another color, said colors being optionally obtained using filters located between said elementary emitting zones and a user of the displaying device.

4. The displaying device of claim 1, wherein:
the elementary emitting zones of the first group generate a white monochrome display, and
the elementary emitting zones of the second group generate a color display, said colors being optionally obtained using filters located between said elementary emitting zones and a user of the displaying device.

5. The displaying device of claim 1, wherein:
the elementary emitting zones of the second group generate a white monochrome display, and
the elementary emitting zones of the first group generate a color display, said colors being optionally obtained using filters located between said elementary emitting zones and a user of the displaying device.

6. The displaying device of claim 1, wherein:
the elementary emitting zones of the second group generate a white color display, and
the elementary emitting zones of the first group generate a color display, said colors being optionally obtained using filters located between said elementary emitting zones and the user of the device.

7. The displaying device of claim 1, wherein the at least one controller is configured to control said emissive display via:
a first control block to control a graphic data stream and/or alphanumeric data stream to be displayed on said pixel matrix array, and
a second control block to control a video data stream to be displayed on said pixel matrix array.

8. The displaying device of claim 7, wherein the at least one controller is configured to control said emissive display such that:
said first control block to cause a display of said graphic data stream or said alphanumeric data stream on the elementary emitting zones of the first group, and
said second control block is to cause a display of said video data stream on the elementary emitting zones of the second group.

9. The displaying device of claim 8, wherein a refresh rate of said video data stream is greater than a refresh rate of said graphic data steam or said alphanumeric data stream.

10. The displaying device of claim 1, wherein the elementary zones of the first group and the elementary zones of the second group do not emit at the same time.

11. The displaying device of claim 1, wherein the elementary zones of the first group emit only when an ambient brightness is greater than a first threshold value.

12. The displaying device of claim 11, wherein the elementary zones of the second group emit only when the ambient brightness is less than a second threshold value.

13. The displaying device of claim 12, wherein said first threshold value is greater than or equal to said second threshold value.

14. The displaying device of claim 13, further comprising a sensing device to:
detect whether the ambient brightness is greater or less than said first threshold value and/or said second threshold value, and
activate and/or deactivate the elementary zones of the group which are to emit or not to emit.

15. A displaying device, comprising:
at least one controller; and
an emissive display, controlled by the at least one controller, said emissive display including a pixel matrix array of light-emitting pixels, each light-emitting pixel in the light-emitting pixels being formed of at least one elementary emitting zone of a first group and at least one elementary emitting zone of a second group;
wherein:

a ratio of a sum of areas of the elementary emitting zones of the second group and of a sum of areas of the elementary emitting zones of the first group is less than 0.05, and a maximum brightness emitted by activated elementary emitting zones of the first group is at least 1000 times greater than a maximum brightness emitted by activated emitting zones of the second group.

16. The displaying device of claim 15, wherein:

the elementary emitting zones of the first group generate a monochrome display, and the elementary emitting zones of the second group generate a monochrome display of the same or of another color, said colors being optionally obtained using filters located between said elementary emitting zones and a user of the displaying device.

17. The displaying device of claim 15, wherein:

the elementary emitting zones of the first group generate a white monochrome display, and the elementary emitting zones of the second group generate a color display, said colors being optionally obtained using filters located between said elementary emitting zones and a user of the displaying device.

18. The displaying device of claim 15, wherein:

the elementary emitting zones of the second group generate a white monochrome display, and the elementary emitting zones of the first group generate a color display, said colors being optionally obtained using filters located between said elementary emitting zones and a user of the displaying device.

19. The displaying device of claim 15, wherein:

the elementary emitting zones of the second group generate a white color display, and the elementary emitting zones of the first group generate a color display, said colors being optionally obtained using filters located between said elementary emitting zones and the user of the device.

20. The displaying device of claim 15, wherein the at least one controller is configured to control said emissive display via:

a first control block to control a graphic data stream and/or alphanumeric data stream to be displayed on said pixel matrix array, and a second control block to control a video data stream to be displayed on said pixel matrix array.

* * * * *